(12) United States Patent
Arbel et al.

(10) Patent No.: US 8,539,403 B2
(45) Date of Patent: Sep. 17, 2013

(54) REDUCING OBSERVABILITY OF MEMORY ELEMENTS IN CIRCUITS

(75) Inventors: Eli Arbel, Nesher (IL); Cynthia Rae Eisner, Zichron Yaacov (IL); Oleg Rokhlenko, Haifa (IL); Karen Frida Yorav, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 13/175,854

(22) Filed: Jul. 3, 2011

(65) Prior Publication Data

US 2013/0007683 A1    Jan. 3, 2013

(51) Int. Cl.
*G06F 9/455* (2006.01)

(52) U.S. Cl.
USPC .......................................................... 716/106

(58) Field of Classification Search
USPC .......................................................... 716/106
See application file for complete search history.

(56) References Cited

U.S. PATENT DOCUMENTS

| | | | |
|---|---|---|---|
| 7,193,876 B1 * | 3/2007 | Park et al. | 365/49.1 |
| 7,310,759 B1 * | 12/2007 | Carmichael et al. | 714/725 |
| 2005/0040844 A1 * | 2/2005 | Plants | 326/9 |
| 2007/0226572 A1 | 9/2007 | Zhang et al. | |
| 2009/0085601 A1 | 4/2009 | Nintunze et al. | |
| 2009/0177932 A1 * | 7/2009 | Abts et al. | 714/704 |
| 2009/0204870 A1 * | 8/2009 | Bieth et al. | 714/755 |
| 2009/0309627 A1 | 12/2009 | Ranganathan et al. | |

OTHER PUBLICATIONS

Chih-Chun Lee et al., "Scalable Exploration of Functional Dependency by Interpolation and Incremental SAT Solving", IEEE 2007.
Smita Krishnaswamy, "Design, Analysis and Test of Logic Circuits under Uncertainty", University of Michigan 2008; URL: http://www.eecs.umich.edu/~imarkov/pubs/diss/SKdiss.pdf.
Srivathsan Krishnamohan and Nihar R. Mahapatra, "A highly-efficient technique for reducing soft errors in static CMOS circuits", IEEE International Conference on Computer Design (ICCD'04).
Natasa Miskov-Zivanov and Diana Marculescu, "Soft error rate analysis for sequential circuits", 2007 EDAA.
Fan Wang and Vishwani D. Agrawal, "Soft Error Rate Determination for Nanoscale Sequential Logic", 2010 IEEE.

* cited by examiner

*Primary Examiner* — Vuthe Siek
*Assistant Examiner* — Mohammed Alam
(74) *Attorney, Agent, or Firm* — Ziv Glazberg; Glazberg & Applbaum Co.

(57) ABSTRACT

A method, apparatus and computer program product for modifying a circuit design. The method comprising: obtaining a design of a circuit, the design comprising at least a first memory element and a second memory element. The method further comprising selecting the second memory element to be a dominant memory element over the first memory element. The method further comprising modifying the design of the circuit by replacing usage of an output signal of the first memory element with usage of an output signal of the dominant memory element in one or more cycles in which values of the output signals of the first memory element and the dominant memory element are equal. Whereby a reduction in observabiltiy of the first memory element in the design is achieved.

20 Claims, 3 Drawing Sheets

US 8,539,403 B2

REDUCING OBSERVABILITY OF MEMORY ELEMENTS IN CIRCUITS

TECHNICAL FIELD

The present disclosure relates to circuit design in general, and to reduction of observabiltiy of memory elements in the design, in particular.

BACKGROUND

Computerized devices are an important part of the modern life. They control almost every aspect of our life—from writing documents to controlling traffic lights. However, computerized devices are bug-prone, and thus require a verification phase in which the bugs should be discovered. The verification phase is considered one of the most difficult tasks in developing a computerized device. Many developers of computerized devices invest a significant portion of the development cycle to discover erroneous behaviors of the computerized device, also referred to as a target computerized system. The target computerized system may comprise hardware, software, firmware, a combination thereof and the like. In some cases, a target device is defined by a design, such as provided by a hardware descriptive language such as VHDL, SystemC, or the like.

A soft error, or a fault, is a transient bit-flip or similar value modification that occurs spontaneously. In some cases, the soft error may be caused due to particle strike. An error in a design occurs when a fault results in data corruption. Typically for hardware designs, an error may be a situation when a corrupted value appears on the outputs of the design (or on a predefined set of cut-points). A fault does not always become an error; it may vanish through logical masking, electrical masking, fault detection modules, and the like. Whether or not a fault becomes an error may depend on a state of the target computerized system when the fault occurs and on input values in subsequent cycles.

The main origin of soft errors is sequential elements. Accordingly, a bit-flip that occurs in a memory element, such as a latch or a flip-flop, which is used in a design, is a fault that is most likely to cause an error. Therefore likelihood soft-errors may be reduced by reducing likelihood of bit-flips in the memory elements.

One method to protect circuits from soft errors is using hardening techniques which increases electrical resistance of the memory elements and thus increases an energy needed to flip the value of the memory element. However, this approach is expensive from power and area point of view. Therefore, there is a limited budget for hardening sequential elements in the circuit.

preventing or reducing likelihood of soft errors is specifically critical in computerized devices that are operated in a hazardous environment, such as outer-space. Such devices may be extremely expensive, and an undetected bug in them may be very costly. For example, consider a bug in a satellite which may cause the satellite to crash. Even a relatively simple bug, such as that causes the satellite to not function correctly may be very expensive to fix, as fixing it may require sending people to outer-space.

SUMMARY

One exemplary embodiment of the disclosed subject matter is a computer-implemented method, the method performed by a computerized device, the method comprising: obtaining a design of a circuit, the design comprising at least a first memory element and a second memory element; selecting the second memory element to be a dominant memory element over the first memory element; modifying the design of the circuit by replacing usage of an output signal of the first memory element with usage of an output signal of the dominant memory element in one or more cycles in which values of the output signals of the first memory element and the dominant memory element are equal; and whereby a reduction in observabiltiy of the first memory element in the design is achieved.

Another exemplary embodiment of the disclosed subject matter is a computerized apparatus having a processor, the apparatus comprising: a design obtainer operative to obtain a design of a circuit, the design comprising at a plurality of memory elements; a dominant selector operative to select a dominant memory element from the plurality of memory elements with respect to a subset of the plurality of memory elements; and a design modifier operative to modify the design by replacing usage of output signals of the subset of the plurality of memory elements with usage of an output signal of the dominant memory element in one or more cycles in which values of the signals are equal.

Yet another exemplary embodiment of the disclosed subject matter is a computer program product, the product comprising: a non-transitory computer readable medium; a first program instruction for obtaining a design of a circuit, the design comprising at least a first memory element and a second memory element; a second program instruction for selecting the second memory element to be a dominant memory element over the first memory element; a third program instruction for modifying the design of the circuit by replacing usage of an output signal of the first memory element with usage of an output signal of the dominant memory element in one or more cycles in which values of the output signals of the first memory element and the dominant memory element are equal; and wherein said first, second, and third program instructions are stored on said non-transitory computer readable medium.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1A:
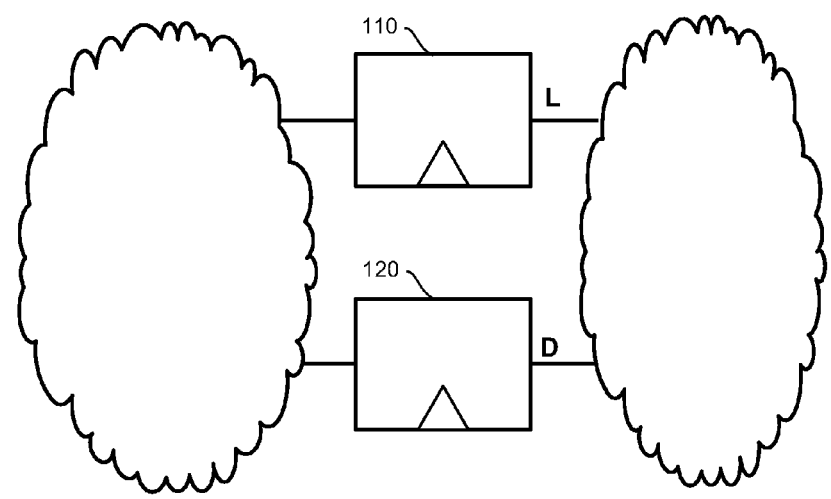
FIGS. 1A and 1B show diagrams of a circuit design, in accordance with some exemplary embodiments of the subject matter.

The disclosed subject matter is described below with reference to flowchart illustrations and/or block diagrams of methods, apparatus (systems) and computer program products according to embodiments of the subject matter. It will be understood that each block of the flowchart illustrations and/ or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to reduce vulnerability of a design to soft-errors. The design may be a design of a circuit, such as a processor, an Integrated Circuit (IC), a Digital Signal Processor (DSP), or any similar device. The circuit may comprise memory elements, such as latches or flip-flops, combinatorial elements, such as AND, XOR, OR or NOT gates, multiplexers or the like. Based on input signals, the circuit may be configured to produce output signals.

One technical solution is to reduce an observability of memory elements in the circuit, and thereby increasing probability that bit flips that occur in the memory element are masked.

Out of a set of memory elements, one memory element may be chosen to be a dominant memory element. The design may be modified so as to increase usage of the output signal of the dominant memory element instead of other memory elements, when applicable. In some exemplary embodiments, the dominant memory element is a memory element that is previously determined to be hardened or otherwise less susceptible to bit-flips. In some exemplary embodiments, the dominant memory element is chosen so as to maximize the number of opportunities to hide observability of other memory elements, such as by summing, for each memory element of the set, the hamming distance from other memory elements (based on some exemplary vectors of values at different cycles) and selecting the memory element having a lowest summation value. In some exemplary embodiments, the set of memory elements may be characterized such that their output values are correlated based on some exemplary vectors.

In some exemplary embodiments, the design may be modified so as to utilize the value of the dominant memory element instead of a value of other memory element, when applicable. A combinatorial function determining whether the values of the two memory elements (dominant and non-dominant) are equal may be computed and a combinatorial logic to select between their output signals may be introduced into the design. In some exemplary embodiments, a multiplexer element is utilized to select between the output signals.

In some exemplary embodiments, an under-approximation of the combinatorial function may be computed and utilized instead of the exact function. The under-approximated function may require a smaller amount of resources, such as computational resources, power consumption, or the like. In some exemplary embodiments, in order to avoid having the output signal of the memory element in the support of the combinatorial function, and thereby avoid reducing its observability, the signal may be universally quantified, and thereby an under-approximation may be determined.

In some exemplary embodiments, the design may be modified so as to utilize one or more preexisting combinatorial logic elements to compute the combinatorial function (either exact or under-approximated).

The design may be utilized to fabricate the circuit. In the fabricated circuit, the dominant memory element may be hardened or otherwise protected against bit-flips.

In some exemplary embodiments, a plurality of groups of memory elements may be determined For each group, a dominant memory element may be selected. The design may be modified with respect to one or more non-dominant memory elements so as to utilize the corresponding dominant memory element when applicable.

One technical effect of utilizing the disclosed subject matter is overriding output signals of non-dominant memory elements, thus making the overridden signals less observable and thus less likely to be the cause of a soft-error. Another technical effect is to modify any existing design, without requiring specific characteristics of the design. Yet another technical effect is not having any restriction on choosing which signal to override. In some exemplary embodiments, although, such a choice may affect quality of the result, it does not affect correctness. Yet another technical effect is reusing existing combinatorial portions of the design to compute the combinatorial function.

Yet another technical effect is reducing likelihood of soft-errors without requiring additional hardening budget. The disclosed subject matter is applicable independently of hardening techniques, so as after the hardening budget is utilized in the design, vulnerability to soft-errors may be further reduced.

Referring now to FIG. 1A showing a diagram of a circuit design, in accordance with some exemplary embodiments of the subject matter. A design 100 comprises at least two memory elements 110, 120, each having an output signal, annotated as L and D. In accordance with the disclosed subject matter, the output signal of one of the memory elements may be logically masked by utilizing the output signal of the other memory element.

Figure 1B:
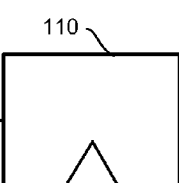
Figure 1B:
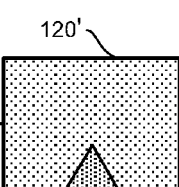

Referring now to FIG. 1B showing a diagram of a modified circuit design, in accordance with some exemplary embodiments of the disclosed subject matter. A modified design 100' is logically equivalent to the design 100. Memory element 120 is selected to be a dominant memory element 120' and the design 100 is modified so as to override the output signal L using output signal D when applicable. A multiplexer 130, or another one or more combinatorial elements, is utilized to select between the output signal L and D. A combinatorial logic 140 is operative to compute a combinatorial function X which is indicative of when the output signal D is the same as L. Based on the value of X, the selection is made by the multiplexer 130. The multiplexer 130 is therefore operative to logically override/mask the output signal of the first memory element 110 (L) with the output signal of the dominant memory element 120' (D), when applicable. The masking is performed when X indicates that there is a masking opportunity.

In some exemplary embodiments, X is defined: X=D=L. In some exemplary embodiments, Binary Decision Diagrams (BDDs) may be utilized to represent the signals D and L, and using these two BDDs, the BDD for X may be computed. Based on the BDD, the combinatorial logic 140 may be synthesized. Other manners of computing X with or without utilizing BDDs are also applicable.

The dominant memory element 120' may be defined to be protected from bit-flips, such as using hardening techniques. In some exemplary embodiments, the dominant memory element 120' may be previously deemed to be protected and therefore selected to be the dominant memory element. Additionally or alternatively, based on the selection of the memory element 120 to be dominant, the dominant memory element 120' may be determined to be protected.

It will be noted that the output signal of the multiplexer 130 may replace the output signal of the first memory element 110 (L) in every usage thereof.

Figure 2:
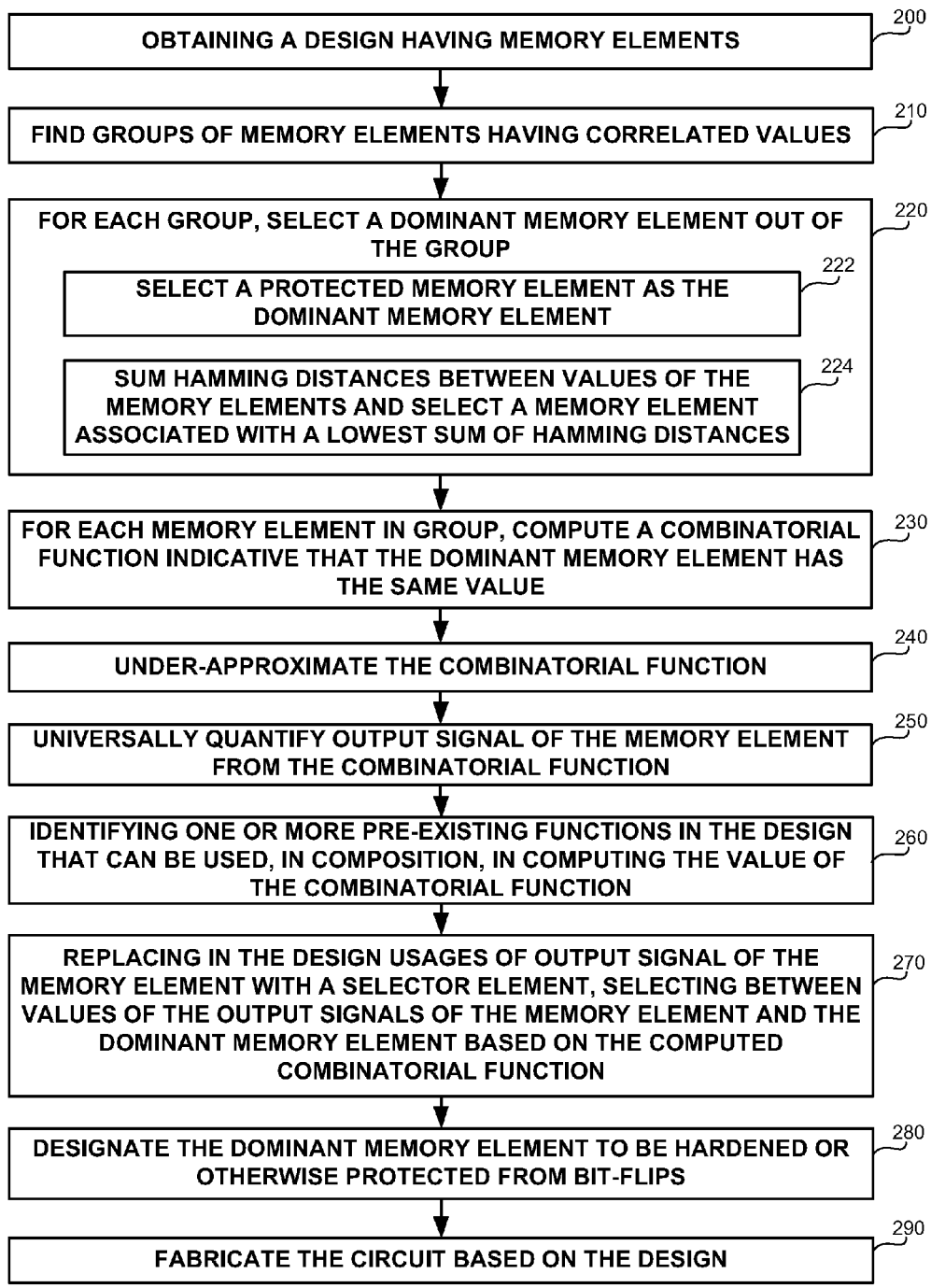
FIG. 2 shows a flowchart diagram of a method, in accordance with some exemplary embodiments of the disclosed subject matter.

Referring now to FIG. 2 showing a flowchart diagram of a method in accordance with some exemplary embodiments of the disclosed subject matter.

In step 200, a design may be obtained. The design may be provided in a formal definition, such as a Hardware Descriptive Language (HDL), Verilog, SystemC, or the like. The design may comprise memory elements and combinatorial elements, which are operative to provide output signals based on input signals.

In step 210, groups of memory elements having correlated values may be determined The groups may be determined based on the formal definition of the design, based on simulated execution of the design, or the like.

In some exemplary embodiments, correlation between the values may be positive (e.g., when x1 is 1 it is more likely that x2 is 1 as well) or negative (e.g., when x1 is 1 it is more likely that x2 is 0). The disclosed subject matter is explained with respect to a positive correlation. However, the disclosed subject matter is applicable also to negative correlation, such as by utilizing a NOT gate on one of the signals to create a transformed signal having positive correlation with the other signal.

One or more groups may be determined. For at least a portion of the groups the following steps may be performed.

In step 220, for each group, a dominant memory element is selected out of the group of memory elements. In some exemplary embodiments, the dominant memory element may be selected based on a pre-existing determination to protect that memory element from bit-flips (step 222). Additionally or alternatively, as is described in step 224, for each memory element of the group, hamming distances from the other memory elements of the group may be computed. With respect to each other memory element, the hamming distance from it may be indicative of a number of masking opportunities that are missed if the memory element is selected as dominant. The memory element which is associated with a lowest summation of hamming distances may be selected. In some exemplary embodiments, if that memory element cannot, for some reason, be selected as a dominant memory element, the memory element having the next lowest sum may be selected, and so forth.

Additionally or alternatively, the dominant memory element may be selected arbitrarily from the group.

The following steps may be performed with respect to all of the non-dominant memory elements of the group. However, for the sake of clarity, they are described with respect to a single non-dominant memory element, also referred to as the masked memory element or recessive memory element.

In step 230, a combinatorial function X may be computed to indicate masking opportunities of the dominant memory element with respect to the recessive memory element. In some exemplary embodiments, the function X=D=L may be built.

Additionally or alternatively, in step 240, under-approximation of X may be determined and utilized instead of the exact function. Any form of under-approximation may be utilized, so as to decrease complexity of computation. Under-approximation may be utilized to reduce a complexity of the function/corresponding synthesized circuit. In some exemplary embodiments, step 240 may be performed in response to a determination that the combinatorial function is too big, such as, for example, the size of the BDD representation of the combinatorial function is above a predetermined threshold. Therefore, only those functions whose size should be reduced are under-approximated.

Additionally or alternatively, in step 250, universal quantification may be utilized to perform under-approximation. By universally quantifying the output signal of the recessive memory element, an under-approximation is determined on the one hand. On the other hand, the universal quantification results in removing the output signal of the recessive memory element from the support vector of the function X. In case the output signal of the recessive memory element is in the support vector of the function X, then by relying on this output signal the disclosed subject matter may not reduce observabiltiy of this output signal.

In step 260, one or more pre-existing functions in the design may be used (e.g., in composition) in computing the value of the combinatorial function.

In some exemplary embodiments, the function X may be searched for in a pool of protected signals of the design. In some exemplary embodiments, the search may be performed by simulating each signal in the pool to find candidates, and then proving equivalence using formal methods (e.g., BDDs or Boolean satisfiability (SAT)).

In some exemplary embodiments, in case the function X (or its under-approximation) is not in the pool of protected signals of the design, it may be composed using plurality of signals by using functional dependency technique. See "Scalable Exploration of Functional Dependency by Interpolation and Incremental SAT Solving", Chih-Chun Lee, Jie-Hong R. Jiang, Chung-Yang Huang, Alan Mishchenko, which is hereby incorporated by reference. Additional or alternative techniques may be utilized for the purpose.

In some exemplary embodiments, the function X is composed of only signals that are included in the protected pool. The protected pool may comprise the input signals and output signals of memory elements which are protected from bit-flips.

In step 270, usages of output signal of the recessive memory element may be replaced by usages of a selector element, such as the multiplexer 130 of FIG. 1B. The selector element may be a combinatorial logic element which is operative to select between the output signal of the recessive memory element and the dominant memory element based on the evaluation of the function X. In some exemplary embodiments, the selector element may be a combinatorial logic synthesized out of, or representing the formula X=1?D:L, where D is the output signal of the dominant memory element and L is the output signal of the recessive memory element, and X is indicative of a masking opportunity upon evaluation to 1.

In step 280, the selected dominant memory element may be indicated to be protected against bit-flips, such as for example, by hardening it.

In step 290, the circuit may be manufactured or otherwise fabricated based on the modified design. The one or more dominant memory elements which were selected by the method may be fabricated as hardened or otherwise less susceptible to bit-flips.

Figure 3:
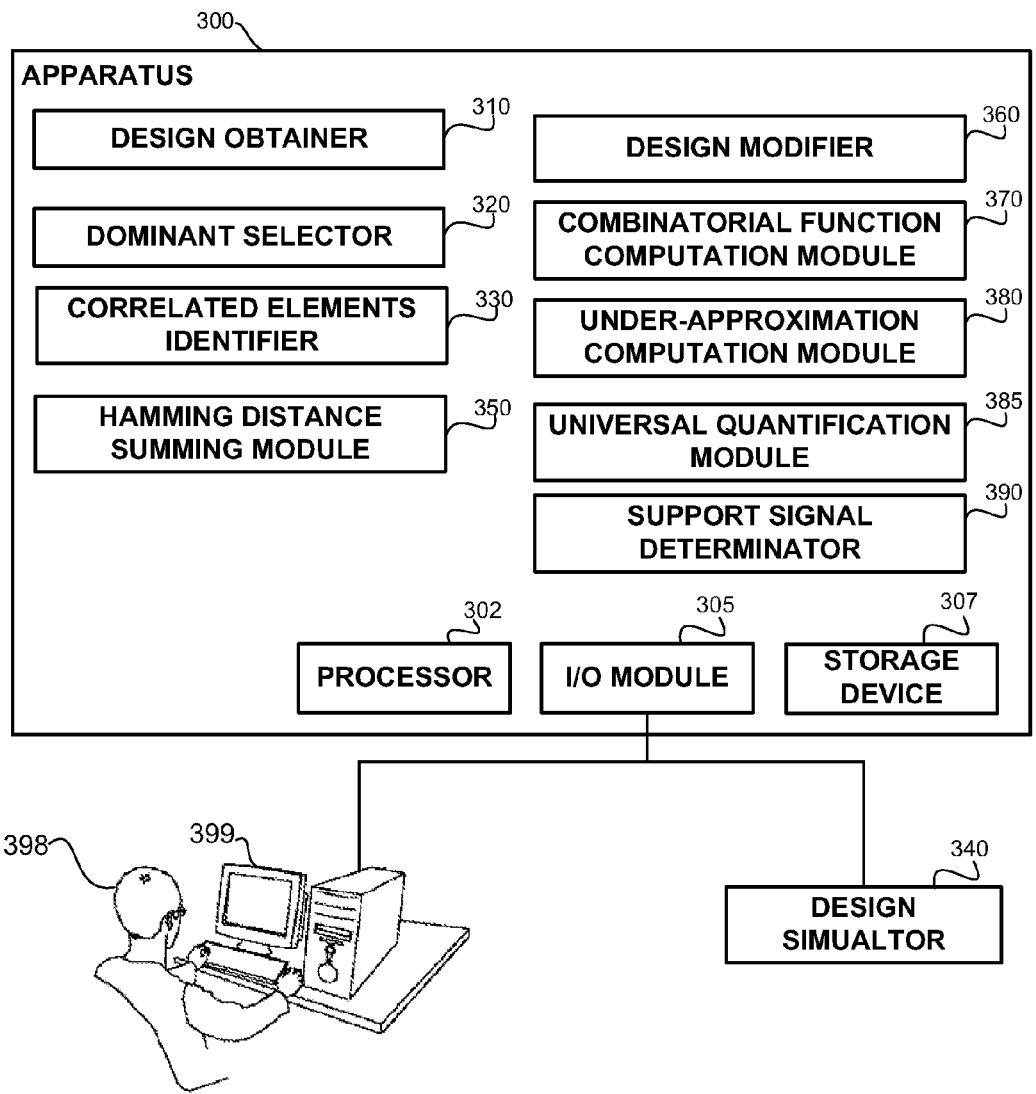
FIG. 3 shows a block diagram of an apparatus, in accordance with some exemplary embodiments of the disclosed subject matter.

Referring now to FIG. 3 showing an apparatus in accordance with some exemplary embodiments of the disclosed subject matter. An apparatus 300 may be configured to modify a design in accordance with the disclosed subject matter. The apparatus 300 may be utilized to perform the method of FIG. 2. Unless otherwise indicated, each subcomponent of apparatus 300 is optional and may be omitted in some exemplary embodiments.

A design obtainer 310 may be operative to obtain a design of a circuit, such as performed in step 200.

A dominant selector 320 may be operative to select a dominant memory element out of a group of memory elements. In some exemplary embodiments, the dominant selector 320 may select a memory element that is determined to be hardened or otherwise less susceptible to bit-flips.

A correlated element identifier 330 may be operative to identify groups of two or more memory elements having correlated values. The groups may be used by the dominant selector 320 to select out of each group a dominant memory element.

In some exemplary embodiments, the group of memory elements may be determined based on a simulated execution of the design, such as performed by a design simulator 340. Additionally or alternatively, a formal engine (not shown), such as a BDD engine or a SAT solver, may be utilized to determine correlation between values of output signals of the memory elements.

In some exemplary embodiments, a hamming distance summing module 350 may be configured to compute hamming distances between values of memory elements at different cycles and sum the values with respect to each memory element. For example, consider a group having four memory elements: e1, e2, e3, e4. Assume a vector of values for each of the memory elements for five hundred cycles is determined (e.g. using the design simulator 340).

A hamming distance between each pair of memory elements may be computed. For example:
e1-e2: 200
e1-e3: 250
e1-e4: 400
e2-e3: 200
e2-e4: 100
e3-e4: 250

For each memory element, a sum of its hamming distances may be computed by the hamming distance summing module 350:
e1: 200+250+400=850
e2: 200+200+100=500
e3: 250+200+250=700
e4: 400+100+250=750

The memory element having a lowest sum value—e2—may be selected as the dominant memory element by the dominant selector 320.

A design modifier 360 may be configured to modify the design by replacing usage of output signal of recessive memory elements with usage of the output signal of the dominant memory element in a plurality of cycles of the design. The design modifier 360 may perform the acts described in step 270. The design modifier 360 may introduce a selector element, such as disclosed hereinabove.

A combinatorial function computation module 370 may be configured to compute a combinatorial function X indicative of masking opportunities with respect to a recessive memory element and a dominant memory element, such as described in step 260.

In some exemplary embodiments, an under-approximation of X may be utilized instead of the exact function. The under-approximation may be computed by an under-approximation computation module 380, such as described in step 240. In some exemplary embodiments, under-approximation may be performed, at least partly, by performing universal quantification using a universal quantification module 385. The universal quantification module 385 may be operative to quantify one or more non-protected signals in the support vector of the function X, such as the output signal of the recessive memory element itself. The support vector of the function X may be determined by a support signal determinator 390.

In some exemplary embodiments, the design modifier 360 may be operative to reuse existing combinatorial functions when introducing the selector element, such as explained with respect to step 260.

In some exemplary embodiments, the apparatus 300 may comprise a processor 302. The processor 302 may be a Central Processing Unit (CPU), a microprocessor, an electronic circuit, an Integrated Circuit (IC) or the like. The processor 302 may be utilized to perform computations required by the apparatus 300 or any of it subcomponents.

In some exemplary embodiments of the disclosed subject matter, the apparatus 300 may comprise an Input/Output (I/O) module 305. The I/O module 305 may be utilized to provide an output to and receive input from the user 398.

In some exemplary embodiments, the apparatus 300 may comprise a storage device 307. The storage device 307 may be a hard disk drive, a Flash disk, a Random Access Memory (ROM), a memory chip, or the like. In some exemplary embodiments, the storage device 307 may retain program code operative to cause the processor 302 to perform acts associated with any of the subcomponents of the apparatus 300. In some exemplary embodiments, the storage device 307 may retain the design, the modified design, the combinatorial function X or its under-approximation, a pool of protected signals or the like.

In some exemplary embodiments, the user 398 may interact with the apparatus 300 using a Man-Machine Interface (MMI) 399 such as a terminal, a display, a keyboard, an input device or the like. The user 398 may provide rules, commands, preferences, and parameters to the apparatus 300. The user 398 may view output of the apparatus 300.

In some exemplary embodiments of the disclosed subject matter, additional masking may be performed with respect to a recessive memory element by masking it using two or more dominant memory elements. For example, a memory element may be masked by either a first dominant memory element or a second dominant memory element. In some cases, it would be preferable to choose the plurality of dominant memory elements to be used such that their value will not be correlated so as to increase a number of masking opportunities.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
obtaining a design of a circuit, the design comprising at least a first memory element and a second memory element, wherein the first and second memory elements are functionally configured to have different values in at least one scenario;
selecting the second memory element to be a dominant memory element over the first memory element;
modifying the design of the circuit by replacing usage of an output signal of the first memory element with usage of an output signal of the dominant memory element in one or more cycles in which values of the output signals of the first memory element and the dominant memory element are equal, wherein said modifying is performed by a computer; wherein said modifying comprises:
computing a combinatorial function indicative of when the values of the output signals of the first memory element and the dominant memory element are equal; and
replacing usages of the output signal of the first memory element with usages of a combinatorial logic operative to provide the output signal of the dominant memory element in response to the indication by the combinatorial function and otherwise operative to provide the output signal of the first memory element; and
whereby a reduction in observabiltiy of the first memory element in the design is achieved.

2. The computer-implemented method of claim 1, wherein said selecting the second element to be the dominant memory element comprises determining that a value of the output signal of the second memory element is correlated with the value of the output signal of the first memory element.

3. The computer-implemented method of claim 1, wherein selecting the second element to be the dominant memory element comprises determining that the second memory element is designed to be fabricated so as to be protected from bit-flips.

4. The computer-implemented method of claim 1, wherein said selecting the second element to be the dominant memory element comprises:
identifying a group of memory elements having correlated values in a plurality of cycles;
computing sums of hamming distances between each memory element of the group and the other memory elements of the group; and
determining that the second memory element is associated with a lowest sum of hamming distances.

5. The computer-implemented method of claim 1, wherein the combinatorial logic is X=1?D:L, wherein X is the combinatorial function, wherein D is the dominant memory element and L is the first memory element.

6. The computer-implemented method of claim 1, wherein said computing further comprises computing an under-approximation of an exact function describing D=L.

7. The computer-implemented method of claim 1, wherein said replacing comprises utilizing one or more preexisting combinatorial logic elements of the design.

8. The computer-implemented method of claim 1, wherein said computing comprises:
universally quantifying the output signal of the first memory element out of the combinatorial function;
whereby the output signal of the first memory element is removed from a support vector of the computed combinatorial function; and
whereby an under-approximation of the combinatorial function is determined.

9. The computer-implemented method of claim 1, further comprising reducing observabiltiy in the design with respect to a plurality of memory elements by modifying the design to replace usage of output signals of the plurality of memory elements with usage of output signals of one or more dominant memory elements, wherein the plurality of memory elements comprises at least the first memory element.

10. The computer-implemented method of claim 9 further comprises:
identifying a plurality of groups of memory elements having correlated values in a plurality of cycles;
with respect to each group, selecting a dominant memory element; and
wherein said modifying comprises modifying the circuit so as to replace usage of output signals of memory elements with usage of corresponding dominant memory elements.

11. The computer-implemented method of claim 1 further comprises indicating the dominant memory element is to be hardened, whereby in a fabricated circuit based on the design, the dominant memory element is less susceptible to bit-flips.

12. A computerized apparatus having a processor, the apparatus comprising:
a design obtainer operative to obtain a design of a circuit, the design comprising at a plurality of memory elements, wherein the first and second memory elements are functionally configured to have different values in at least one scenario;
a dominant selector operative to select a dominant memory element from the plurality of memory elements with respect to a subset of the plurality of memory elements; and
a design modifier operative to modify the design by replacing usage of output signals of the subset of the plurality of memory elements with usage of an output signal of the dominant memory element in one or more cycles in which values of the signals are equal wherein said design modifier is operatively coupled to a combinatorial function computation module, wherein said combinatorial function computation module is operative to compute a combinatorial function indicative of when the values of the output signals of the a memory element and the dominant memory element are equal; and
wherein said design modifier is operative to replace in the design usages of the output signal of the memory element with usages of a combinatorial logic operative to provide the output signal of the dominant memory element in response to the indication by the combinatorial function and otherwise operative to provide the output signal of the memory element.

13. The computerized apparatus of claim 12, further comprises a correlated elements identifier operative to identify groups of two or more memory elements having correlated values, wherein said dominant selector is operative to select the dominant memory element from the group.

14. The computerized apparatus of claim 13, wherein said correlated elements identifier is operatively coupled to a design simulator operative to simulate operation of the design and produce values of output signals of the plurality of memory elements at different cycles.

15. The computerized apparatus of claim 12, wherein said dominant selector is operative to select a dominant memory element based on a design of a memory element to be fabricated so as to be protected from bit-flips.

16. The computerized apparatus of claim 12, wherein said dominant selector is operatively coupled to a hamming distance summing module, wherein said hamming distance summing module is operative to compute sums of hamming distances with respect to a group of memory elements; and wherein said dominant selector is operative to select a memory element of the group having a lowest sum of hamming distances.

17. The computerized apparatus of claim 12, wherein said design modifier is operatively coupled to an under-approximation computation module operative to compute an under-approximation of the combinatorial function.

18. The computerized apparatus of claim 17, wherein said under-approximation computation module is operatively coupled to a universal quantification module operative to perform under-approximation by universally quantifying a signal out of a function.

19. The computerized apparatus of claim 17, further comprising a support signals determinator operative to determine support signals that are used in computing value of the combinatorial function; and wherein said under-approximation computation module is operative to utilize the universal quantification module to quantify at least a portion of the support signals.

20. A computer program product comprising
a non-transitory computer readable medium retaining program instructions medium retaining program instructions, which instructions when read by a processor, cause the processor to perform a method comprising:
obtaining a design of a circuit, the design comprising at least a first memory element and a second memory element, wherein the first and second memory elements are functionally configured to have different values in at least one scenario;
selecting the second memory element to be a dominant memory element over the first memory element; and
modifying the design of the circuit by replacing usage of an output signal of the first memory element with usage of an output signal of the dominant memory element in one or more cycles in which values of the output signals of the first memory element and the dominant memory element are equal wherein said design "and; wherein said modifying comprises: computing a combinatorial function indicative of when the values of the output signals of the first memory element and the dominant memory element are equal; and replacing usages of the output signal of the first memory element with usages of a combinatorial logic operative to provide the output signal of the dominant memory element in response to the indication by the combinatorial function and otherwise operative to provide the output signal of the first memory element.

* * * * *